United States Patent
Kataoka

(10) Patent No.: US 10,447,295 B2
(45) Date of Patent: Oct. 15, 2019

(54) CODING METHOD, CODING DEVICE, DECODING METHOD, AND DECODING DEVICE

(71) Applicant: FUJITSU LIMITED, Kawasaki-shi, Kanagawa (JP)

(72) Inventor: Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/940,081

(22) Filed: Mar. 29, 2018

(65) Prior Publication Data

US 2018/0226986 A1    Aug. 9, 2018

Related U.S. Application Data

(63) Continuation of application No. PCT/JP2015/078120, filed on Oct. 2, 2015.

(51) Int. Cl.
*H03M 7/12*    (2006.01)
*H03M 7/40*    (2006.01)

(52) U.S. Cl.
CPC ............... *H03M 7/12* (2013.01); *H03M 7/40* (2013.01); *H03M 7/4037* (2013.01); *H03M 7/4068* (2013.01)

(58) Field of Classification Search
CPC .... H03M 7/12; H03M 7/4037; H03M 7/4068; H03M 7/40
USPC ............................................................ 341/51
See application file for complete search history.

(56) References Cited

U.S. PATENT DOCUMENTS

| | | | | |
|---|---|---|---|---|
| 4,186,375 A | * | 1/1980 | Castellani | G11B 20/1492 360/40 |
| 4,811,113 A | | 3/1989 | Ozeki et al. | |
| 5,287,490 A | * | 2/1994 | Sites | G06F 8/52 717/142 |
| 5,548,110 A | * | 8/1996 | Storch | G06F 11/14 235/462.07 |

(Continued)

FOREIGN PATENT DOCUMENTS

| | | |
|---|---|---|
| JP | 54-156446 | 12/1979 |
| JP | 62-298280 | 12/1987 |

(Continued)

OTHER PUBLICATIONS

Extended European Search Report dated Aug. 28, 2018 in corresponding European Patent Application No. 15905480.8, 7 pages.

(Continued)

*Primary Examiner* — Brian K Young
(74) *Attorney, Agent, or Firm* — Xsensus LLP

(57) ABSTRACT

A non-transitory computer-readable recording medium having stored therein a coding program that causes a computer to execute a process. The process includes coding a numerical value to be coded, into a numeric code of base-$2^n$ representation; and generating code data that have been added with an instantaneous code indicating the number of digits of the base-$2^n$ representation of the numerical value to be coded, wherein "n" is a natural number equal to or greater than 1.

7 Claims, 14 Drawing Sheets

(56) References Cited

U.S. PATENT DOCUMENTS 6,959,412 B2 * 10/2005 Silvus ................ G11B 20/1426
341/83

FOREIGN PATENT DOCUMENTS

| JP | 63-269623 | 11/1988 |
|----|-----------|---------|
| JP | 07-273661 | 10/1995 |

OTHER PUBLICATIONS

Simon J. Puglisi, "Data Compression Techniques", Internet Article, Feb. 3, 2015, XP002783950, Retrieved from the Internet: URL:https://www.cs.helsinki.fi/u/puglisi/dct2015/slides3.pdf [retrieved on Aug. 17, 2018], 46 pages.
"Elias gamma coding", Wikipedia, Dec. 15, 2014, XP002783951, Retrieved from the Internet: URL:https://en.wikipedia.org/w/index.php?title=Elias_gamma_coding&oldid=638126020 [retrieved on Aug. 17, 2018], 3 pages.
International Search Report dated Dec. 15, 2015 in PCT/JP2015/078120 filed Oct. 2, 2015 (with English Translation).
Written Opinion dated Dec. 15, 2015 in PCT/JP2015/078120 filed Oct. 2, 2015.
Japanese Office Action dated Apr. 9, 2019, issued in corresponding Japanese Patent Application No. 2017-542666, 5 pages.

* cited by examiner

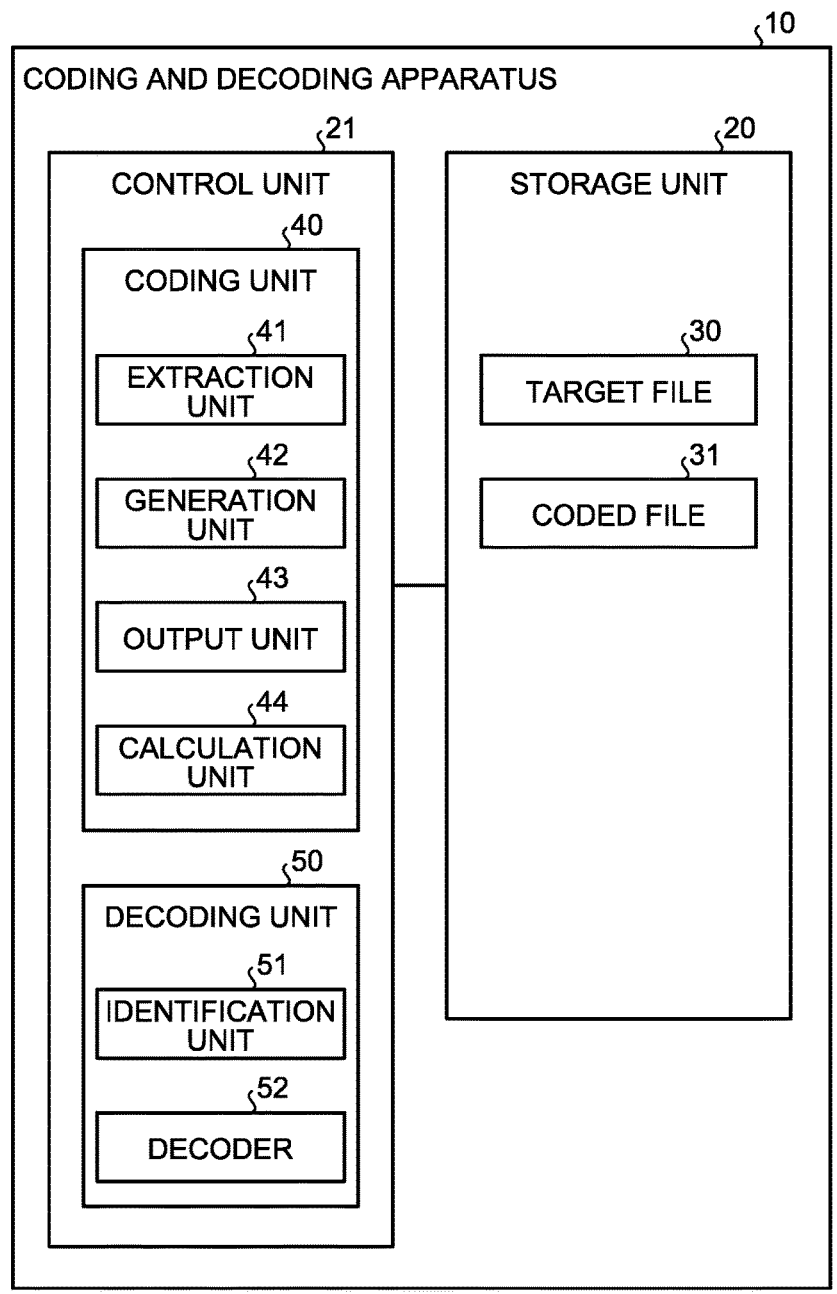

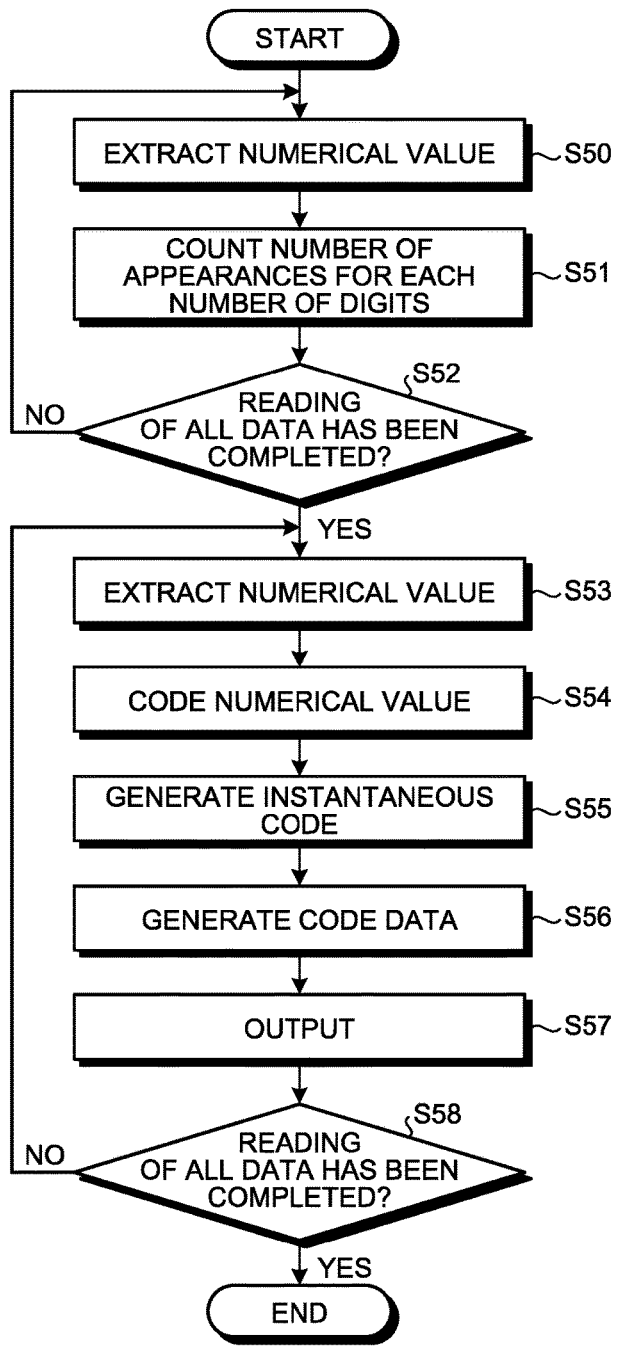

FIG.12

| | INSTANTANEOUS CODES | | | | | |
|---|---|---|---|---|---|---|
| BASE-4 ONE-DIGIT | 0 | 11 | | | | |
| BASE-4 TWO-DIGIT | 10 | 11 | 11 | | | |
| BASE-4 THREE-DIGIT | 110 | 11 | 11 | 11 | | |
| BASE-4 FOUR-DIGIT | 1110 | 11 | 11 | 11 | 11 | |
| BASE-4 FIVE-DIGIT | 11110 | 11 | 11 | 11 | 11 | 11 |

FIG.13

| | INSTANTANEOUS CODE | | | | | |
|---|---|---|---|---|---|---|
| BASE-16 ONE-DIGIT | 0 | 1111 | | | | |
| BASE-16 TWO-DIGIT | 10 | 1111 | 1111 | | | |
| BASE-16 THREE-DIGIT | 110 | 1111 | 1111 | 1111 | | |
| BASE-16 FOUR-DIGIT | 1110 | 1111 | 1111 | 1111 | 1111 | |
| BASE-16 FIVE-DIGIT | 11110 | 1111 | 1111 | 1111 | 1111 | 1111 |

CODING METHOD, CODING DEVICE, DECODING METHOD, AND DECODING DEVICE

CROSS-REFERENCE TO RELATED APPLICATION

This application is a continuation application of International Application PCT/JP2015/078120, filed on Oct. 2, 2015, and designating the U.S., the entire contents of which are incorporated herein by reference.

FIELD

The present invention relates to a coding program, a coding method, a coding device, a decoding program, a decoding method, and a decoding device.

BACKGROUND

There exists a technique for representing numerical values with, for example, variable-length bit representations. When numerical values are represented by variable-length bit representation, a code length of data representing a numerical value is determined according to the magnitude and the number of significant figures, of the numerical value. For example, if a bit representation of a numerical value is in n-bit units, and the head "m" bits of data representing the numerical value correspond to the number of significant figures; the numerical value is able to be represented with "$2m-1$" digits of base-$2^n$. For example, a case will be considered, where a numerical value is represented; with a bit representation of the numerical value being in 3-bit units (base-8), and the head three bits of data representing the numerical value corresponding to the number of significant figures. Numerical values, "0" to "7", are each able to be represented by a single octal digit. Therefore, a code length in total of the data representing each of the numerical values, "0" to "7", is six bits including: the head three bits (001) with the number of significant figures being one digit; and three bits of its numerical portion. If the number of significant figures is seven, a 7-digit numerical value is able to be represented by octal representation. A code length in total of data representing a 7-digit octal numerical value is 24 bits including: the head three bits (111) with the number of significant figures being seven; and 21 bits of its numerical portion.

Patent Literature 1: Japanese Laid-open Patent Publication No. 07-273661

Patent Literature 2: Japanese Laid-open Patent Publication No. 63-269623

In general, the appearance frequency, at which a numerical value appears in a document or the like, tends to be inversely proportional to the magnitude of the numerical value. For example, the appearance frequency of a one-digit numerical value, such as "1", is high, and the larger the number of digits of a numerical value is, the lower its appearance frequency is. Therefore, if a small numerical value is able to be represented by a short code length, its data are able to be compressed small.

However, with the above described conventional technique, since data of a compressed numerical value are added with "m" bits indicating the number of significant figures, a code length of a small numerical value becomes long, and thus data may be unable to be compressed at a high compression rate.

SUMMARY

According to an aspect of an embodiment, a non-transitory computer-readable recording medium stores therein a coding program that causes a computer to execute a process. The process includes coding a numerical value to be coded, into a numeric code of base-$2^n$ representation; and generating code data that have been added with an instantaneous code indicating the number of digits of the base-$2^n$ representation of the numerical value to be coded, wherein "n" is a natural number equal to or greater than 1.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a diagram illustrating an example of a configuration of a coding and decoding apparatus according to a second embodiment.

FIG. 11A is a flow chart illustrating an example of a procedure of coding processing according to the second embodiment.

FIG. 12 is a diagram illustrating an example where numerical values are coded in base-4 representation by a decoding technique according to this embodiment.

FIG. 13 is a diagram illustrating an example where numerical values are coded in hexadecimal representation by a decoding technique according to this embodiment.

DESCRIPTION OF EMBODIMENTS

Hereinafter, embodiments of a coding program, a coding method, a coding device, a decoding program, a decoding method, and a decoding device, which are disclosed by the present application, will be described in detail, based on the drawings. The scope of rights is not limited by these embodiments. The embodiments may be combined with one another as appropriate, so long as no contradiction arises in the content of the processing.

First Embodiment

Coding Processing

Figure 1:
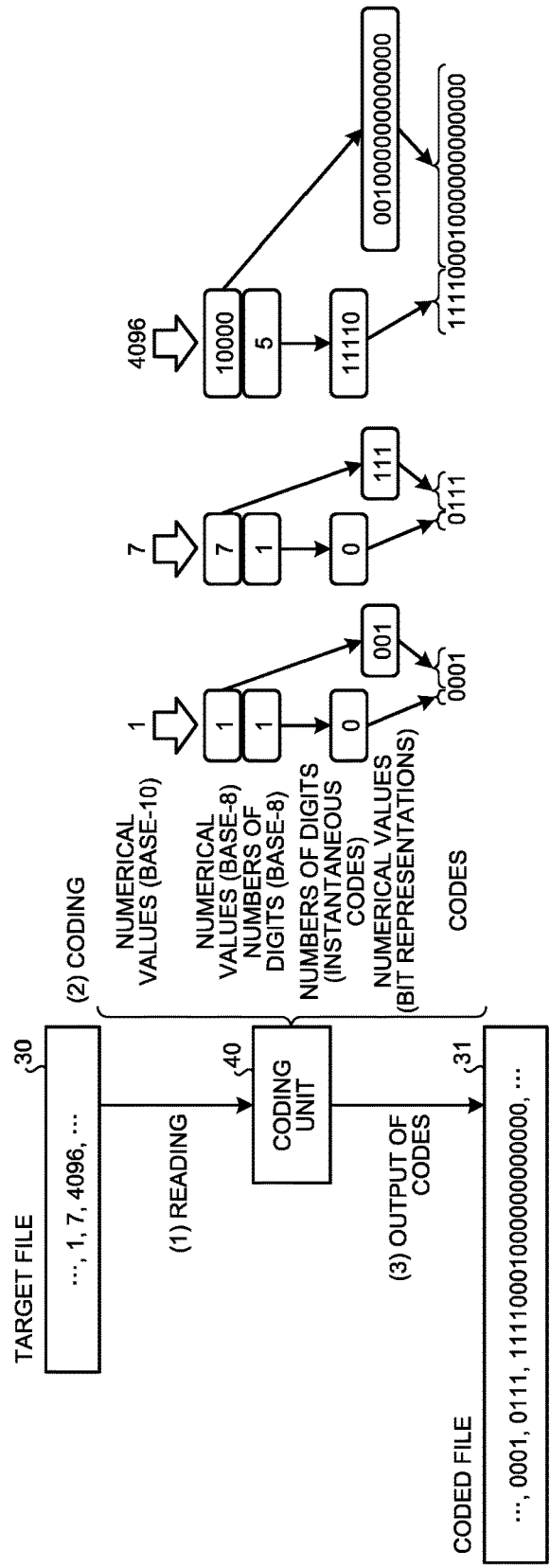
FIG. 1 is a diagram schematically illustrating a flow of coding of a numerical value.

First of all, by use of FIG. 1, an outline of coding processing on a numerical value executed by a coding and decoding apparatus 10 according to a first embodiment will be described. FIG. 1 is a diagram schematically illustrating a flow of coding of a numerical value. A target file 30 includes data of plural numerical values. For example, the target file 30 has data of plural numerical values stored therein, the data having been separated by use of a predetermined separating character. With respect to FIG. 1, a case will be described as an example, where, for example, the coding and decoding apparatus 10 executes coding of " . . . , 1, 7, 4096, . . . " included in the target file 30 that is a target to be compressed. In the example of FIG. 1, the numerical values stored in the target file 30 are represented by decimal notation. In the target file 30, the numerical values, "1", "7", and "4096", are stored by being separated from one another by the separating character, "," (comma). The target file 30 illustrated in FIG. 1 is just an example, and the present invention is not limited to this example.

A coding unit 40 of the coding and decoding apparatus 10 sequentially reads the numerical values from the target file 30 ((1) in FIG. 1). In the example of FIG. 1, the respective numerical values, "1", "7, and "4096", are read in order. The coding unit 40 converts each of the read numerical values into a code ((2) in FIG. 1). For example, the coding unit 40 executes coding of a numerical value into a numeric code of octal representation with a bit representation of the numerical value being in 3-bit units, and converts the numerical value into code data that have been added with an instantaneous code indicating the number of digits of the numerical value in its octal representation. For example, the coding unit 40 converts a decimal numerical value to an octal numerical value. In the example of FIG. 1, the decimal numerical value, "1", is converted into an octal numerical value, "1". The decimal numerical value, "7", is converted into an octal numerical value, "7". The decimal numerical value, "4096", is converted into an octal numerical value, "10000". Each of the decimal numerical values, "1" and "7", also has one digit in its octal representation. On the contrary, the decimal numerical value, "4096", has five digits in its octal representation. The coding unit 40 codes an octal numerical value into bits. For example, the coding unit 40 codes a value of each digit of an octal numerical value into three bits. In the example of FIG. 1, the octal numerical value, "1", is coded into "001". The octal numerical value, "7", is coded into "111". The octal numerical value, "10000", is coded into "001000000000000". The coding unit 40 adds an instantaneous code indicating the number of digits of the octal numerical value at the head of the numeric code coded from the numerical value. In this embodiment, in an instantaneous code, in order of the numbers of digits, from the head bit, the number of bits is associated with each bit. The number of bits of an instantaneous code corresponds to the number of digits of a numerical value in octal representation; and "0" is set to a bit corresponding to the number of digits of the numerical value, and "1" is set to bits not corresponding to the number of digits of the numerical value. Thereby, the number of digits is able to be identified by the timing when "0" appears in the instantaneous code, by the number of bits being counted in order from the head bit to the appearance of "0". For example, in FIG. 1, since each of the decimal numerical values, "1" and "7", has one digit in its octal representation, its instantaneous code is "0". Since the decimal numerical value, "4096", has five digits in its octal representation, its instantaneous code is "11110". By determination of values of bits from the head of an instantaneous code, the number of digits is able to be identified from the bit number where "0" appears. For example, if "0" appears in the first bit, the number of digits of the numerical value is able to be identified as one. Further, if "0" appears in the fifth bit from the head, the number of digits of the numerical value is able to be identified as five. In front of a numeric code that has been coded from a numerical value, the coding unit 40 adds an instantaneous code of the numerical value. In the example of FIG. 1, the decimal numerical value, "1", is coded into "0001" by addition of the instantaneous code, "0", in front of "001". The decimal numerical value, "7", is coded into "0111" by addition of the instantaneous code, "0", in front of "111". The decimal numerical value, "4096", is coded into "11110001000000000000" by addition of the instantaneous code, "11110", in front of "001000000000000". As described above, the decimal numerical values, "1" and "7", are each coded into a total of four bits including one bit of the instantaneous code and three bits of the numerical portion. Further, the decimal numerical value, "4096", is coded into a total of 20 bits including five bits of the instantaneous code and 15 bits of its numerical portion. The coding unit 40 outputs code data having an instantaneous code added in front of a numeric code that has been coded from an octal numerical value ((3) in FIG. 1). In the example of FIG. 1, the coding unit 40 stores each set of code data in a coded file 31. As described above, the coding unit 40 is able to compress a small numerical value into a code of a short code length. Thereby, the coding unit 40 is able to compress data at a high compression rate.

Decoding Processing

Figure 2:
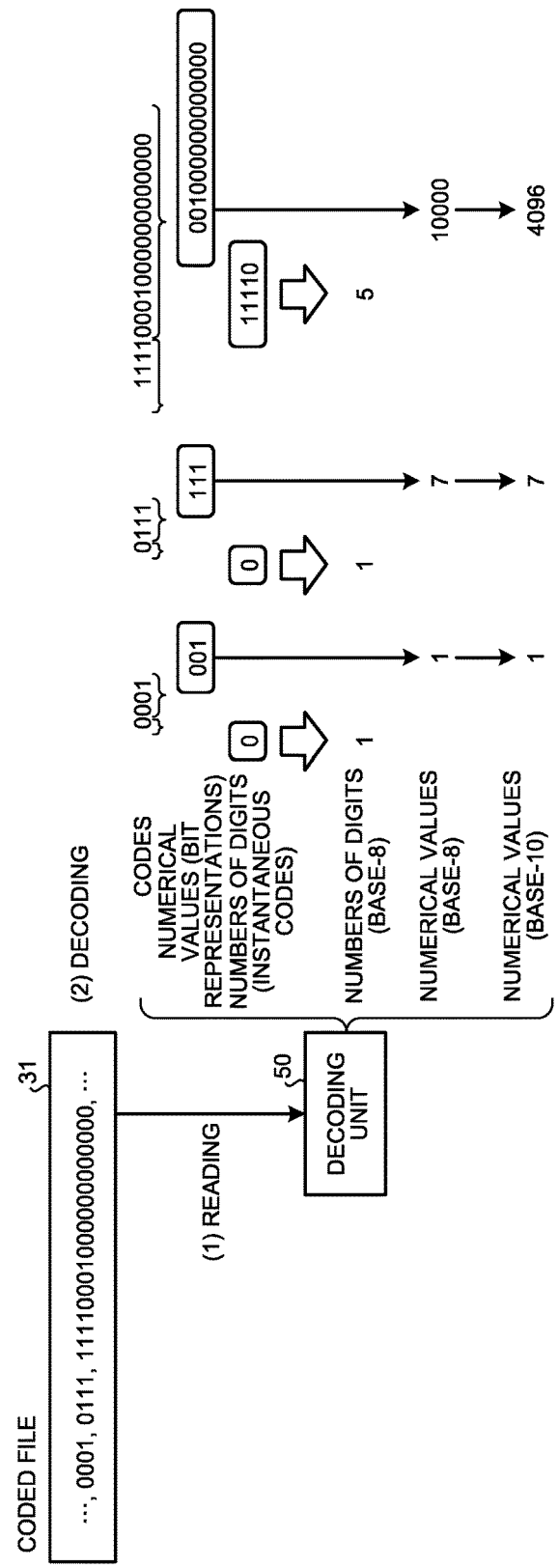
FIG. 2 is a diagram schematically illustrating a flow of decoding of a numerical value.

Next, by use of FIG. 2, an outline of decoding processing on a numerical value executed by the coding and decoding apparatus 10 according to the first embodiment will be described. FIG. 2 is a diagram schematically illustrating a flow of decoding of a numerical value. A decoding unit 50 of the coding and decoding apparatus 10 sequentially reads code data of numerical values from the coded file 31 ((1) in FIG. 2). In the example of FIG. 2, each of "0001", "0111", and "11110001000000000000", which has been coded in FIG. 1, is read. The decoding unit 50 decodes each set of code data that has been read ((2) in FIG. 2). For example, the decoding unit 50 counts the number of bits from the head bit to the appearance of "0" in each set of code data that has been read, and identifies the number of digits of the instantaneous code. In the example of FIG. 2, since the first bit at the head of "0001" is "0", the number of digits is identified as one. Since the first bit at the head of "0111" is also "0", the number of digits is identified as one. Since the fifth bit from the head of "11110001000000000000" is "0", the number of digits is identified as five. The decoding unit 50 separates the instantaneous code from a set of code data to extract the code of the numerical portion, and decodes the code of the numerical portion into a numerical value in bit units according to the number of digits identified from the instantaneous code. In the example of FIG. 2, the code, "0001", is decoded into the octal numerical value, "1", or the decimal numerical value, "1", by the code, "001", of its numerical portion being separated by exclusion of its instantaneous code, "0", at its head. The code, "0111", is decoded into the octal numerical value, "7", or the decimal numerical value, "7", by the code, "111", of its numerical portion being separated by exclusion of its instantaneous code, "0", at its head. The code, "11110001000000000000", is decoded into the octal numerical value, "10000", or the decimal numerical value, "4096", by the code, "001000000000000" of its numerical portion being separated by exclusion of its instantaneous code, "11110", at its head. As described above, the decoding unit 50 is able to decompress code data that have been coded into a short code length into its original numerical value.

Apparatus Configuration

Figure 3:
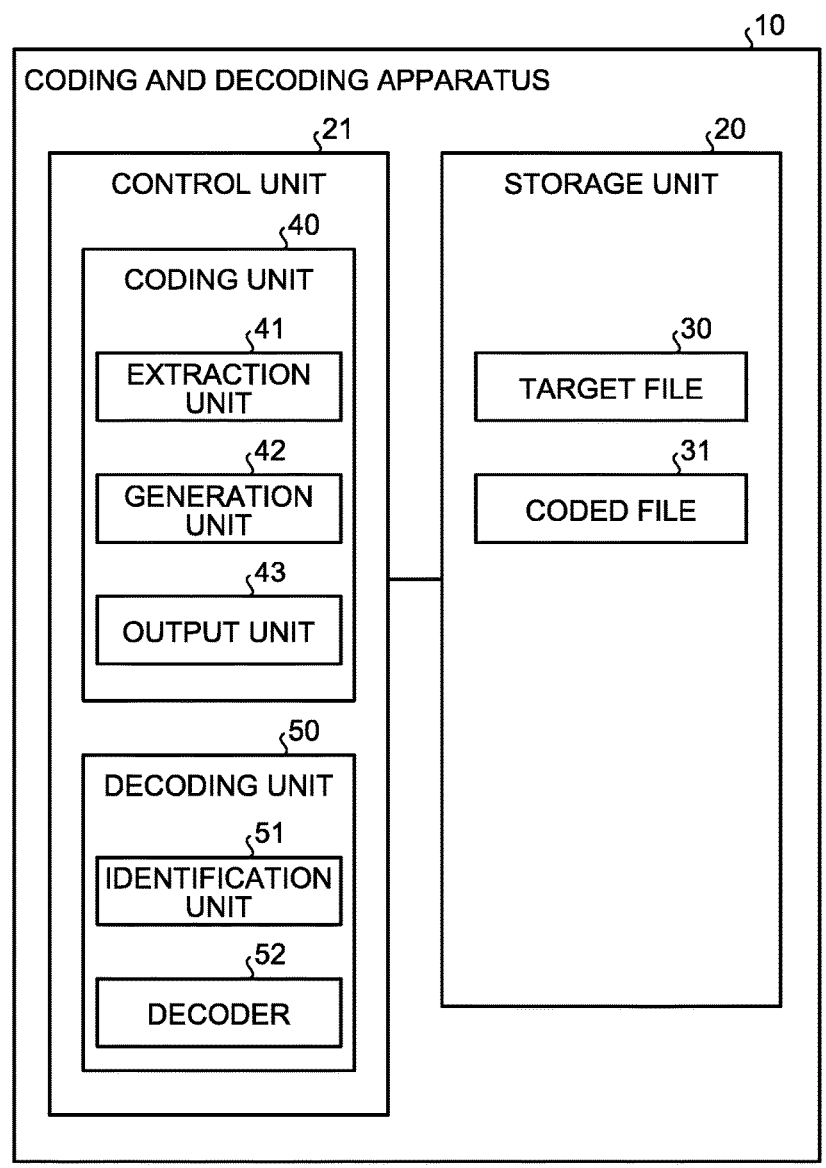
FIG. 3 is a diagram illustrating an example of a configuration of a coding and decoding apparatus according to a first embodiment.

Next, a configuration of the coding and decoding apparatus 10 will be described. FIG. 3 is a diagram illustrating an example of a configuration of a coding and decoding apparatus according to the first embodiment. The coding and decoding apparatus 10 is an apparatus that executes coding, such as compression, of the target file 30, and decoding of data that have been compressed. The coding and decoding apparatus 10 is, for example: a computer, such as a personal computer or a server computer; or an information processing apparatus, such as a tablet terminal or a smartphone. The coding and decoding apparatus 10 may be implemented as a single computer, or may be implemented as a cloud with plural computers. In this embodiment, a case where the coding and decoding apparatus 10 is implemented as a single computer will be described as an example. As illustrated in FIG. 3, the coding and decoding apparatus 10 has a storage unit 20 and a control unit 21. The coding and decoding apparatus 10 may have, in addition to the above mentioned devices, any other device that computers and information processing apparatuses have.

The storage unit 20 is a storage device, such as a hard disk, a solid state drive (SSD), or an optical disk. The storage unit 20 may be a data-rewritable semiconductor memory, such as a random access memory (RAM), a flash memory, or a non-volatile static random access memory (NVSRAM).

The storage unit 20 stores therein an operating system (OS) and various programs, executed by the control unit 21. For example, the storage unit 20 stores therein a program for execution of compression processing described later. Further, the storage unit 20 stores therein various data used in the programs executed by the control unit 21. For example, the storage unit 20 stores there in the target file 30 and the coded file 31.

The target file 30 is a file, in which numerical values to be coded have been stored. The coded file 31 is data obtained by coding processing of the numerical values in the target file 30.

The control unit 21 is a device that controls the coding and decoding apparatus 10. As the control unit 21: an electronic circuit, such as a central processing unit (CPU) or a micro processing unit (MPU); or an integrated circuit, such as an application specific integrated circuit (ASIC) or a field programmable gate array (FPGA), may be adopted. The control unit 21 has an internal memory for storing therein programs, which prescribe various processing procedures, and control data; and the control unit 21 executes various types of processing by using the programs and the control data. The control unit 21 functions as various processing units by various programs being operated. For example, the control unit 21 has the coding unit 40 and the decoding unit 50.

The coding unit 40 extracts the numerical values from the target file 30, and generates, in units of the extracted numerical values, the coded file 31 resulting from coding of the numerical values. The coding unit 40 has an extraction unit 41, a generation unit 42, and an output unit 43.

The extraction unit 41 executes extraction of the numerical values from the target file 30. For example, the extraction unit 41 reads data from the target file 30, and extracts the numerical values from the read data.

The generation unit 42 generates code data corresponding to the respective numerical values extracted by the extraction unit 41. For example, the generation unit 42 codes an extracted numerical value into a numeric code of octal representation, and generates code data that have been added with an instantaneous code indicating the number of digits of the numerical value in its octal representation. For example, the generation unit 42 converts an extracted numerical value into an octal numerical value. The generation unit 42 codes a value of each digit of the octal numerical value into three bits. The generation unit 42 generates code data by adding an instantaneous code indicating the number of digits of the octal numerical value at the head of the numeric code that has been coded from the octal numerical value.

The output unit 43 outputs the code data generated by the generation unit 42. For example, correspondingly to each of the numerical values extracted by the extraction unit 41, the output unit 43 outputs the set of code data generated by the generation unit 42 into the coded file 31 and stores the coded file 31.

The decoding unit 50 executes decoding of the coded file 31. The decoding unit 50 has an identification unit 51 and a decoder 52.

The identification unit 51 sequentially reads the sets of code data that have been stored in the coded file 31. The identification unit 51 counts the number of bits from the head bit to the appearance of "0" in each of the read sets of code data, and identifies the number of digits of the instantaneous code. By this identification of the number of digits from the instantaneous code, the identification unit 51 is able to identify the number of digits when "0" appears, without checking any bits after the appearance.

The decoder 52 decompresses the numerical value of each of the sets of code data read from the coded file 31. For example, the decoder 52 extracts the code of the numerical portion by separating the instantaneous code from a set of code data. According to the number of digits identified from the instantaneous code, the decoder 52 decodes the code of the numerical portion into a numerical value in 3-bit units.

A format, in which the numerical values are stored in a storage area, may be a data type format, such as an integer type format. For example, if a numerical value is stored in a storage area, such as a memory, with a data type of the numerical value being defined, an area of a size corresponding to the data type is secured in the storage area. For example, if a numerical value, "1", is stored in the 32-bit integer type, a storage area of 32 bits is used for the numerical value. Further, if a data type is defined for numerical values, only numerical values in a range corresponding to the data type are able to be stored. For example, with the unsigned 32-bit integer type, only numerical values in a range of "0" to "4294967295" are able to be stored.

When a numerical value larger than the range of the 32-bit integer type is stored, the numerical value is stored in a larger-bit integer type, and thus a larger storage area is used for the numerical value. In general, appearance frequency, at which numerical values appear in a document or the like, tends to be inversely proportional to the magnitude of the numerical values. However, if a data type of numerical values is defined according to the largest numerical value, the storage area used for the numerical values becomes uselessly large. For example, if plural appearing numerical values are made to be of the 64-bit integer type for one of the plural appearing numerical values not being in the range of the 32-bit integer type; since an area of 64 bits is secured for each numerical value, the size of a storage area secured for the numerical values becomes uselessly large.

On the contrary, with a coding technique according to this embodiment, a small numerical value is able to be coded into a short code, and thus the data size is able to be compressed. In the example of FIG. 1, the decimal numerical values, "1" to "7", are each able to be stored in four bits. Further, with the coding technique according to this embodiment, the number of digits is able to be changed by the instantaneous code. Therefore, a numerical value is converted into a code of a code length corresponding to the magnitude of the numerical value. That is, with the coding technique according to this embodiment, a small numerical value is converted into a code of a short code length, and the larger a numerical value is, the longer the code length of the code, into which the numerical value is converted, is. Therefore, with the coding technique according to this embodiment, the size of the storage area secured for numerical values is prevented from becoming uselessly large. Furthermore, the coding technique according to this embodiment has no upper limit to the number of digits representable by an instantaneous code. Therefore, the coding technique according to this embodiment has no upper limit to a numerical value that is able to be coded. That is, no matter how large a numerical value is, the numerical value is able to be coded and stored.

Figure 4:
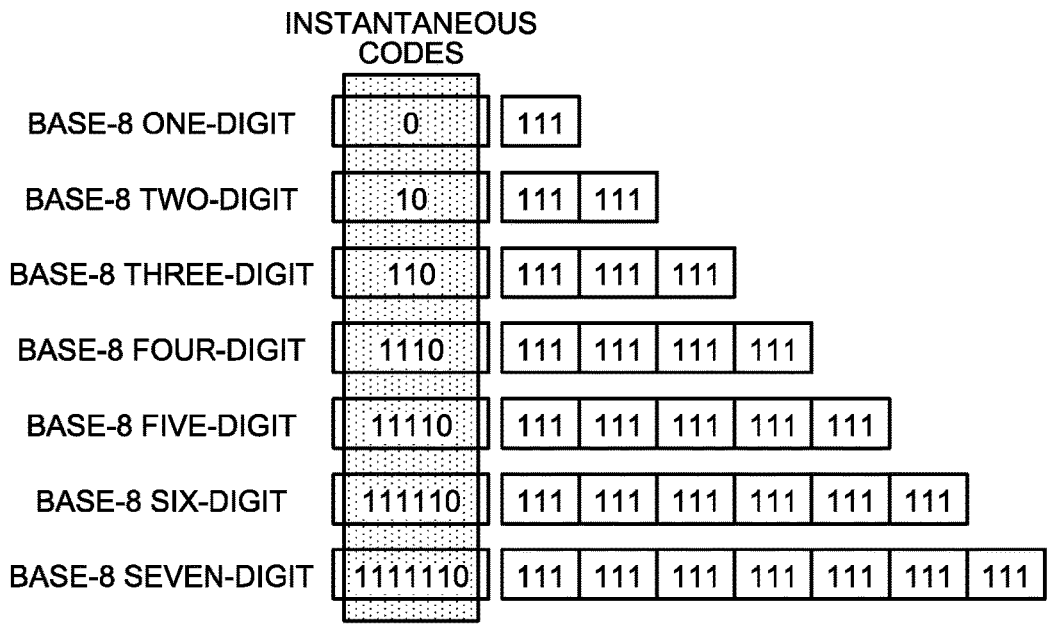
FIG. 4A is a diagram illustrating an example where numerical values are coded in octal representation by a decoding technique according to this embodiment.
FIG. 4B is a diagram illustrating an example where numerical values are coded in variable-length bit representation according to a conventional technique.

Next, the coding technique according to this embodiment will be compared with a case where a numerical value is coded in variable-length bit representation. FIG. 4A is a diagram illustrating an example where numerical values are coded in octal representation by the decoding technique according to this embodiment. In the example of FIG. 4A, codes are illustrated, which are obtained by: coding of numerical values into numeric codes in octal representation, with bit representations of the numerical values being in 3-bit units; and addition of instantaneous codes indicating the numbers of digits of the numerical values in their octal representations. In the example of FIG. 4A, a one-digit octal numerical value is coded into four bits. For example, the octal numerical value, "7", is coded into a total of four bits including the instantaneous code, "0", and the code, "111", of its numerical portion. A two-digit octal numerical value is coded into eight bits. For example, an octal numerical value, "77", is coded into a total of eight bits including an instantaneous code, "10", and a code, "111111", of its numerical portion. A three-digit octal numerical value is coded into twelve bits. For example, an octal numerical value, "777", is coded into a total of twelve bits including an instantaneous code, "110", and a code, "111111111", of its numerical portion. A four-digit octal numerical value is coded into 16 bits. For example, an octal numerical value, "7777", is coded into a total of 16 bits including an instantaneous code, "110", and a code, "111111111111", of its numerical portion. A five-digit octal numerical value is coded into 20 bits. For example, an octal numerical value, "77777", is coded into a total of 20 bits including an instantaneous code, "11110", and a code, "111111111111111", of its numerical portion. A six-digit octal numerical value is coded into 24 bits. For example, an octal numerical value, "777777", is coded into a total of 24 bits including an instantaneous code, "111110", and a code, "111111111111111111", of its numerical portion. A seven-digit octal numerical value is coded into 28 bits. For example, an octal numerical value, "7777777", is coded into a total of 28 bits including an instantaneous code, "1111110", and a code, "111111111111111111111", of its numerical portion.

In contrast, FIG. 4B is a diagram illustrating an example where numerical values are coded in variable-length bit representation according to a conventional technique. In the example of FIG. 4B, codes are illustrated, each of which is obtained by a numerical value being coded into a numeric code in octal representation, with its head three bits representing the number of significant figures. In the example of FIG. 4B, a one-digit octal numerical value is coded into six bits. For example, the octal numerical value, "7", is coded into a total of six bits including: the head three bits, "001", indicating that the number of significant figures is one; and the code, "111", of its numerical portion. A two-digit octal numerical value is coded into nine bits. For example, the octal numerical value, "77", is coded into a total of nine bits including: the head three bits, "010", indicating that the number of significant figures is two; and the code, "111111", of its numerical portion. A three-digit octal numerical value is coded into twelve bits. For example, the octal numerical value, "777", is coded into a total of twelve bits including: the head three bits, "011", indicating that the number of significant figures is three; and the code, "111111111", of its numerical portion. A four-digit octal numerical value is coded into 15 bits. For example, the octal numerical value, "7777", is coded into a total of 15 bits including: the head three bits, "100", indicating that the number of significant figures is three; and the code, "111111111111", of its numerical portion. A five-digit octal numerical value is coded into 18 bits. For example, the octal numerical value, "77777", is coded into a total of 18 bits including: the head three bits, "101", indicating that the number of significant figures is three; and the code, "111111111111111", of its numerical portion. A six-digit octal numerical value is coded into 21 bits. For example, the octal numerical value, "777777", is coded into a total of 21 bits: including the head three bits, "110", indicating that the number of significant figures is three; and the code, "111111111111111111", of its numerical portion. A seven-digit octal numerical value is coded into 24 bits. For example, the octal numerical value, "7777777", is coded into a total of 24 bits including: the head three bits, "111", indicating that the number of significant figures is three; and the code, "111111111111111111111", of its numerical portion.

As illustrated in FIG. 4A and FIG. 4B, with the coding technique according to the embodiment, when the number of significant figures of an octal numerical value is one or two, its code becomes shorter than that coded by the conventional coding technique. With the coding technique according to this embodiment, when the number of significant figures of an octal numerical value is four or more, its code becomes longer than that coded by the conventional coding technique.

Figure 5:
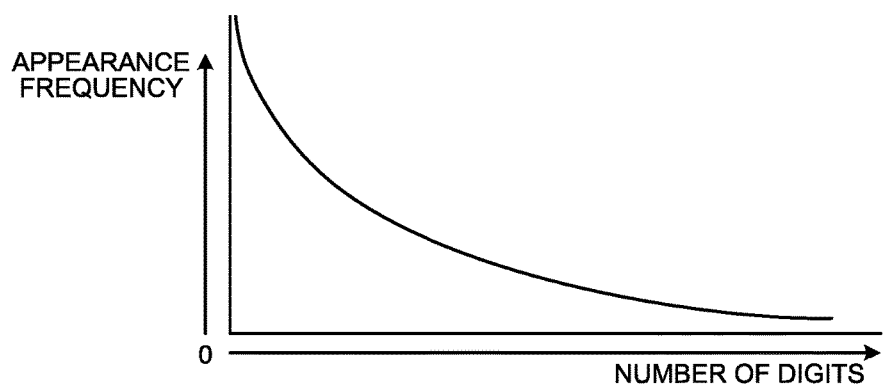
FIG. 5 is a diagram schematically illustrating change in appearance frequency of numerical values.

In general, appearance frequency, at which numerical values appear in a document or the like, tends to be inversely proportional to the magnitude of the numerical values. FIG. 5 is a diagram schematically illustrating change in appearance frequency of numerical values. As illustrated in FIG. 5, the appearance frequency of a one-digit numerical value, such as "1", is high, and the larger the number of digits of a numerical value is, the lower its appearance frequency is. In data compression, if a short code is assigned to data high in appearance frequency, the compression rate is increased. Therefore, with the coding technique according to this embodiment, by conversion of small numerical values into short codes, the data as a whole are able to be compressed small.

Figure 6:
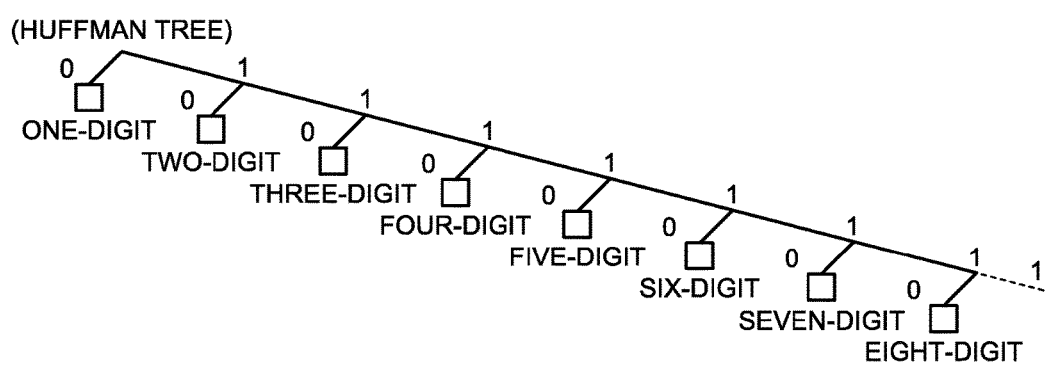
FIG. 6 is a diagram illustrating an example of a Huffman tree used in determination on an instantaneous code.

In this embodiment, the case where, for respective bits of an instantaneous code, a bit corresponding to the number of digits of a numerical value is set to "0" and bits not corresponding to the number of digits of the numerical value are set to "1", has been described, but the instantaneous code is not limited to this case. For example, for a particular number of bits, a bit corresponding to the number of digits of a numerical value may be set to "1" and bits not corresponding to the number of digits of the numerical value may be set to "0". FIG. 6 is a diagram illustrating an example of a Huffman tree used in determination on an instantaneous code. According to the Huffman tree illustrated in FIG. 6, the number of digits is determined by determination of values of respective bits in order from the head bit of an instantaneous code. For example, if the first bit of an instantaneous code is "0", in the Huffman tree, the first leaf is reached, and thus the number of digits is determined to be one. If the first bit of an instantaneous code is "1", in the Huffman tree, the first node is reached, and whether the second bit is "0" or "1" is determined. If the second bit of an instantaneous code is "0", in the Huffman tree, the second leaf is reached, and the number of digits is determined to be two. In this Huffman tree, for a particular number of bits, by determination, in which a bit corresponding to the number of digits of a numerical value is "0" and bits not corresponding to the number of digits are "1", the number of digits is able to be determined.

Figure 7:
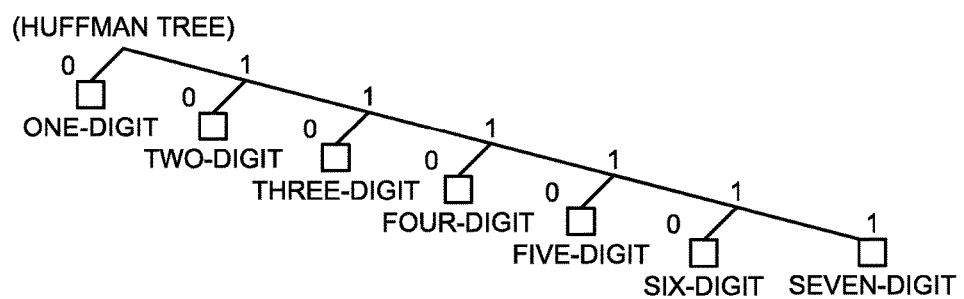
FIG. 7 is a diagram illustrating an example of a Huffman tree used in determination on an instantaneous code.

Further, an upper limit may be provided to the number of representable digits, and two digits may be associated with the most significant bit. FIG. 7 is a diagram illustrating an example of a Huffman tree used in determination on an instantaneous code. The example in FIG. 7 illustrates a case where the upper limit of the number of representable digits is seven. An instantaneous code is able to represent up to seven digits with six bits by: the sixth significant bit being made "0" when the number of digits of a numerical value is six; and the sixth significant bit being made "1" when the number of digits of a numerical value is seven. As described above, by provision of an upper limit to a representable number of digits for an instantaneous code, and association of the "upper limit number of digits—1"th bit of the instantaneous code with the "upper limit number of digits—1" digits and the upper limit number of digits, the instantaneous code corresponding to the upper limit number of digits is able to be shortened by one bit.

Flow of Processing

Figure 8A:
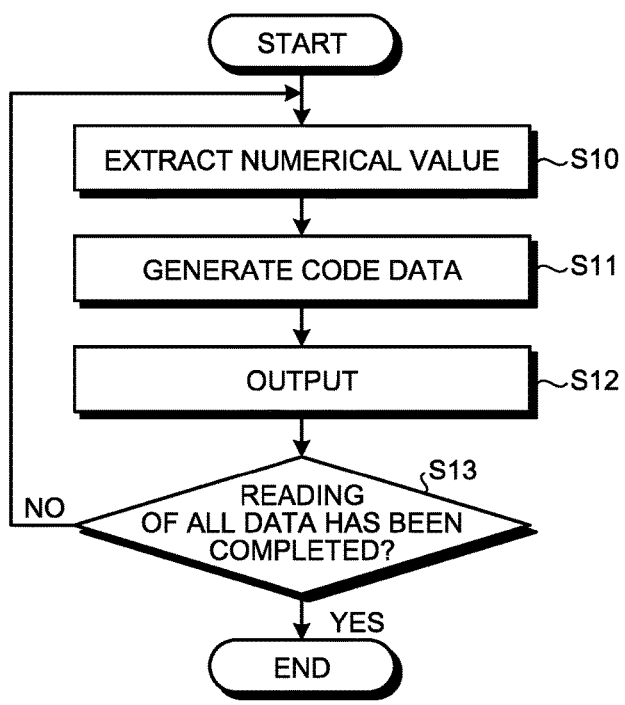
FIG. 8A is a flow chart illustrating an example of a procedure of coding processing according to the first embodiment.

A flow of coding processing, in which the coding and decoding apparatus 10 according to the first embodiment compresses the target file 30 by coding the target file 30, will be described. FIG. 8A is a flow chart illustrating an example of a procedure of coding processing according to the first embodiment. This coding processing is executed at a predetermined timing, for example, when predetermined operation, by which the target file 30 is specified and start of coding is instructed, is performed.

As illustrated in FIG. 8A, the extraction unit 41 reads data from the target file 30, and extracts a numerical value from the read data (S10). The generation unit 42 generates code data corresponding to the extracted numerical value (S11). For example, the generation unit 42 codes an extracted numerical value into a numeric code of octal representation, and generates code data that have been added with an instantaneous code indicating the number of digits of the numerical value in its octal representation. The output unit 43 outputs the generated code data (S12). For example, the output unit 43 outputs the code data generated correspondingly to the numerical value, into the coded file 31, and stores the coded file 31.

The extraction unit 41 determines whether or not reading of all of data from the target file 30 has been completed (S13). If the reading has not been completed (S13: No), the processing proceeds to S10 described above.

On the contrary, if the reading has been completed (S13: Yes), the processing is ended.

Figure 8B:
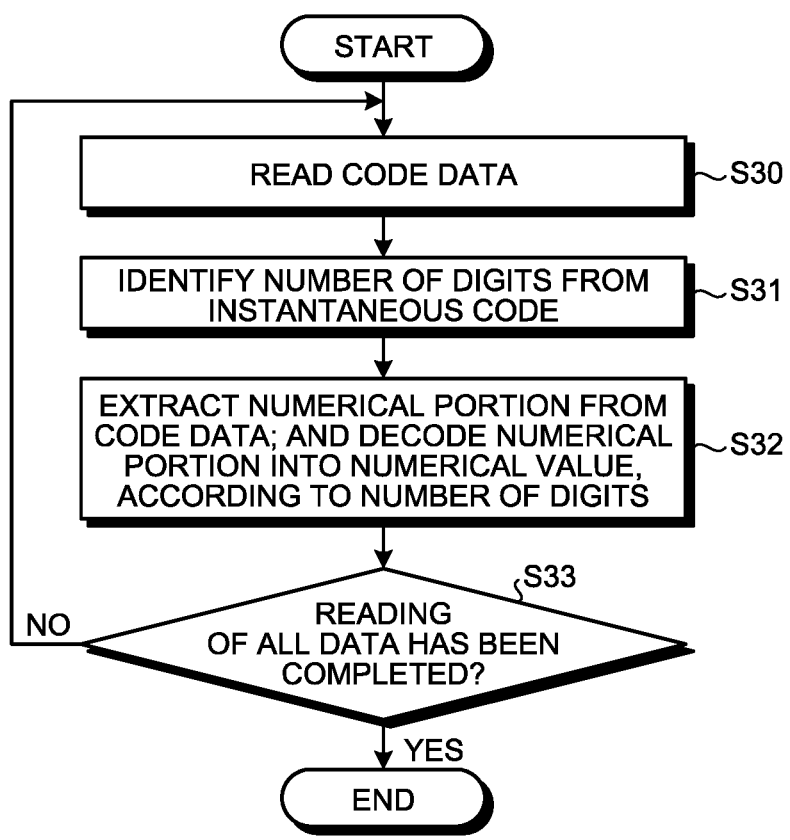
FIG. 8B is a flow chart illustrating an example of a procedure of decoding processing according to the first embodiment.

Next, a flow of decoding processing, in which the coding and decoding apparatus 10 according to the first embodiment decodes code data stored in the coded file 31, will be described. FIG. 8B is a flow chart illustrating an example of a procedure of decoding processing according to the first embodiment. This decoding processing is executed at a predetermined timing, for example, when predetermined operation, by which the coded file 31 is specified and start of decoding is instructed, is performed.

As illustrated in FIG. 8B, the identification unit 51 reads code data stored in the coded file 31 (S30). The identification unit 51 counts the number of bits from the head bit to the appearance of "0" in order in each set of the read code data, and identifies the number of digits from the instantaneous code (S31).

The decoder 52 separates the instantaneous code from the code data, and decodes the separated code of the numerical portion into a numerical value in 3-bit units according to the identified number of digits (S32).

The identification unit 51 determines whether or not reading of all of data from the coded file 31 has been completed (S33). If the reading has not been completed (S33: No), the processing proceeds to S30 described above.

On the contrary, if the reading has been completed (S33: Yes), the processing is ended.

Effects

As described above, the coding and decoding apparatus 10 according to this embodiment codes a numerical value to be coded, into a numeric code of octal representation, and generates code data that have been added with an instantaneous code indicating the number of digits of the octal representation of the numerical value to be coded. Thereby, the coding and decoding apparatus 10 is able to compress a small numerical value into a code of a short code length. As a result, the coding and decoding apparatus 10 is able to compress data at a high compression rate.

Further, the coding and decoding apparatus 10 according to this embodiment generates code data that have been added with an instantaneous code, in which the numbers of digits have been associated with the respective bits from the head bit in order of the numbers of digits, and which indicates the number of digits of the octal representation of the numerical value to be coded. Thereby, the coding and decoding apparatus 10 is able to generate an instantaneous code with a short code length for a numerical value with a small number of digits in its octal representation.

Further, the coding and decoding apparatus 10 according to this embodiment identifies the number of digits in an octal representation from the instantaneous code in the code data. The coding and decoding apparatus 10 decodes the numeric code in the code data in 3-bit units, into a numerical value, according to the identified number of digits. Thereby, the coding and decoding apparatus 10 is able to reconstruct the numerical value that has been coded as the code data.

Second Embodiment

Next, a second embodiment will be described. FIG. 9 is a diagram illustrating an example of a configuration of a coding and decoding device according to the second embodiment. The same reference signs will be assigned to portions that are the same as those of the above described coding and decoding apparatus 10 according to the first embodiment, and portions different therefrom will be mainly described.

The coding unit 40 further has a calculation unit 44. The calculation unit 44 calculates an appearance frequency of each of the numbers of digits of respective octal representations of numerical values included in the target file 30. For example, the calculation unit 44 converts each numerical value extracted by the extraction unit 41 into an octal representation, and for each of the numbers of digits of the numerical values in octal representation, counts the number of its appearances. For example, if 100 one-digit numerical values in octal representation and 1000 two-digit numerical values in octal representation are included in the target file 30, the calculation unit 44 counts the number of appearances of the one-digit numerical values as 100 times and the number of appearances of the two-digit numerical values as 1000 times.

The generation unit 42 codes a numerical value extracted by the extraction unit 41 into a numeric code of octal representation. Further, the generation unit 42 generates code data that have been added with an instantaneous code, in which the numbers of digits have been associated with the bits from the head bit in descending order of the appearance frequencies of the numbers of digits calculated by the calculation unit 44, and which indicates the number of digits of the octal representation of the numerical value to be coded. For example, if the number of appearances of one-digit numerical values is 100 times, and the number of appearances of two-digit numerical values is 1000 times, the generation unit 42 generates code data, with the instantaneous code for two digits being "0" and the instantaneous code for one digit being "10". Thereby, a two-digit numerical value in octal representation, for example, is coded into a total of seven bits including one bit of its instantaneous code and six bits of its numerical portion. Further, a one-digit numerical value in octal representation is coded into a total of five bits including two bits of its instantaneous code and three bits of its numerical portion.

As described above, by assignment of a short instantaneous code to the number of digits high in appearance frequency, the compression rate is increased. Therefore, by the coding technique according to this embodiment, by representation of the number of digits high in appearance frequency with a short instantaneous code, the data as a whole are able to be compressed small.

Figure 10:
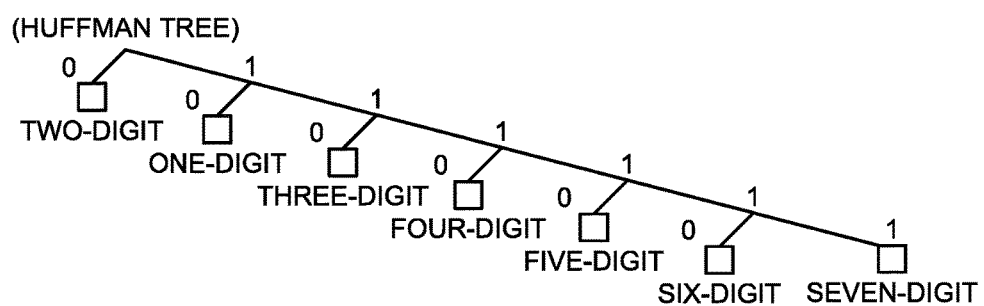
FIG. 10 is a diagram illustrating an example of a Huffman tree used in determination on an instantaneous code.

The generation unit 42 generates number-of-digits information indicating correspondence between respective bits of instantaneous codes and the numbers of digits. For example, the generation unit 42 generates, as the number-of-digits information, information on a Huffman tree used in determination on instantaneous codes. FIG. 10 is a diagram illustrating an example of a Huffman tree used in determination on an instantaneous code. In the example of FIG. 10, if the first bit of an instantaneous code is "0", the number of digits is determined to be two, and if the first bit of an instantaneous code is "1" and the second bit thereof is "0", the number of digits is determined to be one.

Correspondingly to each of the numerical values extracted by the extraction unit 41, the output unit 43 outputs a set of code data generated by the generation unit 42 into the coded file 31 and stores the coded file 31. Further, the output unit 43 outputs the number-of-digits information generated by the generation unit 42, into the coded file 31, and stores the coded file 31. For example, the output unit 43 stores the number-of-digits information in a header or a footer of the coded file 31.

When the coded file 31 is decompressed, the number of digits is identified, based on the number-of-digits information, from an instantaneous code. For example, the identification unit 51 of the decoding unit 50 identifies the number of digits from an instantaneous code, according to the Huffman tree illustrated in FIG. 10, which is generated from the number-of-digits information in the coded file 31.

Flow of Processing

A flow of coding processing, in which the coding and decoding apparatus 10 according to the second embodiment compresses the target file 30 by coding the target file 30, will be described. FIG. 11A is a flow chart illustrating an example of a procedure of coding processing according to the second embodiment. This coding processing is executed at a predetermined timing, for example, when predetermined operation, by which the target file 30 is specified and start of coding is instructed, is performed.

As illustrated in FIG. 11A, the extraction unit 41 reads data from the target file 30, and extracts numerical values from the read data (S50). The calculation unit 44 converts each numerical value extracted by the extraction unit 41 into an octal representation, and for each of the numbers of digits of the numerical values in octal representation, counts the number of its appearances (S51). The extraction unit 41 determines whether or not reading of all of data from the target file 30 has been completed (S52). If the reading has not been completed (S52: No), the processing proceeds to S50 described above.

On the contrary, if the reading has been completed (S52: Yes), the extraction unit 41 reads data from the target file 30 again, and extracts a numerical value from the read data (S53). The generation unit 42 codes the extracted numerical value into a numeric code of octal representation (S54). The generation unit 42 generates an instantaneous code, in which the numbers of digits have been associated with the bits from the head bit in descending order of the appearance frequencies of the numbers of digits calculated by the calculation unit 44, and which indicates the number of digits of the octal representation of the numerical value to be coded (S55). The generation unit 42 then generates code data having the instantaneous code added before the code of the coded numerical value (S56).

The output unit 43 outputs the generated code data (S57). For example, the output unit 43 outputs a set of code data generated correspondingly to the numerical value, into the coded file 31, and stores the coded file 31.

The extraction unit 41 determines whether or not reading of all of data from the target file 30 has been completed (S58). If the reading has not been completed (S58: No), the processing proceeds to S53 described above.

On the contrary, if the reading has been completed (S58: Yes), the output unit 43 stores the number-of-digits information in the coded file 31, and ends the processing.

Figure 11B:
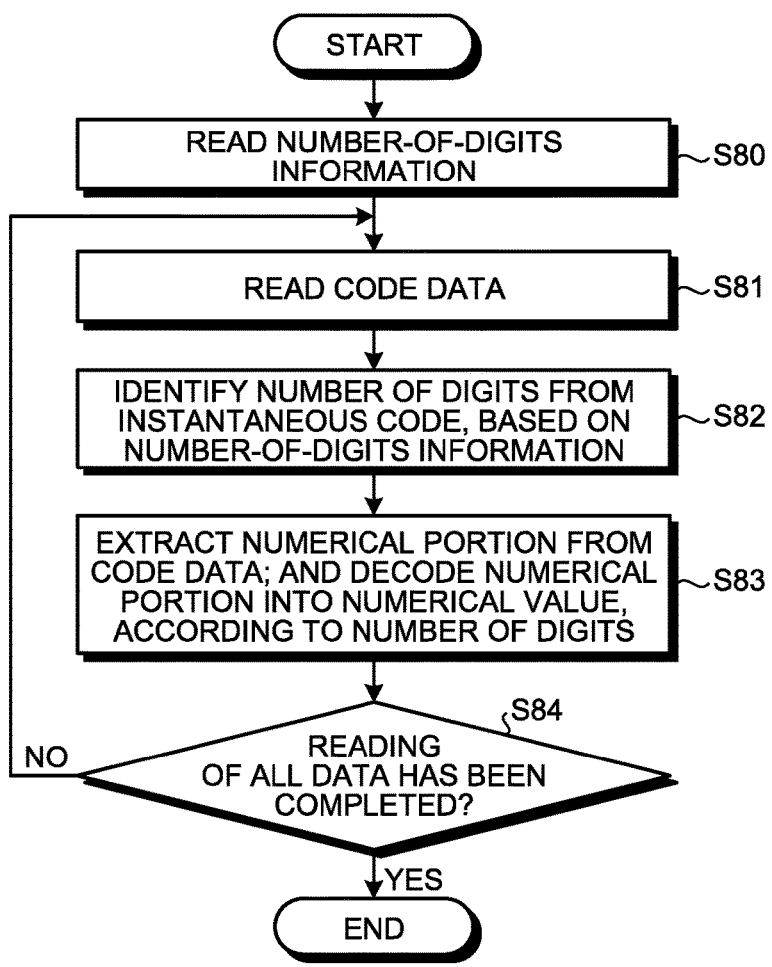
FIG. 11B is a flow chart illustrating an example of a procedure of decoding processing according to the second embodiment.

Next, a flow of decoding processing, in which the coding and decoding apparatus 10 according to the second embodiment decodes code data stored in the coded file 31, will be described. FIG. 11B is a flow chart illustrating an example of a procedure of decoding processing according to the second embodiment. This decoding processing is executed at a predetermined timing, for example, when predetermined operation, by which the coded file 31 is specified and start of decoding is instructed, is performed.

As illustrated in FIG. 11B, the identification unit 51 reads the number-of-digits information stored in the coded file 31 (S80). The identification unit 51 reads the code data from the coded file 31 (S81). The identification unit 51 counts the number of bits from the head bit to the appearance of "0" in order in each set of the read code data, and identifies, based on the number-of-digits information, the number of digits from the instantaneous code (S82).

The decoder 52 separates the instantaneous code from the set of code data, and decodes the separated code of the numerical portion into a numerical value in 3-bit units according to the identified number of digits (S83).

The identification unit 51 determines whether or not reading of all of data from the coded file 31 has been completed (S84). If the reading has not been completed (S84: No), the processing proceeds to S81 described above.

On the contrary, if the reading has been completed (S84: Yes), the processing is ended.

Effects

As described above, the coding and decoding apparatus 10 according to this embodiment calculates an appearance frequency for each of the numbers of digits of plural numerical values to be coded in their octal representations. The coding and decoding apparatus 10 generates code data that have been added with an instantaneous code, in which the numbers of digits have been associated with the bits from the head bit in descending order of the calculated appearance frequencies of the numbers of digits, and which indicates the number of digits of the octal representation of the numerical value to be coded. Thereby, the coding and decoding apparatus 10 enables instantaneous codes of numerical values, which are in octal representation and have the numbers of digits high in appearance frequency, to be shortened, and enables compression of these numerical values into codes of short code lengths. Thereby, the coding and decoding apparatus 10 is able to compress data at a compression rate that is even higher.

Third Embodiment

Although the embodiments related to the disclosed apparatuses have been described above, the disclosed techniques may be implemented in various different modes, in addition to the above described embodiments. Therefore, hereinafter, other embodiments included in the present invention will be described.

For example, with respect to the above described embodiments, the case where a numerical value to be coded is coded into a numeric code in base-8 ($=2^3$) representation has been described, but the present invention is not limited to this case. A numerical value to be coded may be coded into a numeric code in any base-$2^n$ representation (where "n" is a natural number equal to or greater than "1"). For example, a numerical value to be coded may be coded into a numeric code in base-4 ($=2^2$) representation. FIG. 12 is a diagram illustrating an example where numerical values are coded in base-4 representation by a decoding technique according to this embodiment. As illustrated in FIG. 12, a one-digit numerical value in base-4 representation is coded into three bits. For example, a numerical value, "3", in base-4 representation is coded into a total of three bits including the instantaneous code, "0", and a code, "11", of its numerical portion. A two-digit numerical value in base-4 representation is coded into six bits. For example, a numerical value, "33", in base-4 representation is coded into a total of six bits including the instantaneous code, "10", and a code, "1111", of its numerical portion. In a case where decimal numerical values, "1" to "3", appear frequently in the target file 30, by coding of these in base-4 representation, the data are able to be compressed small. Further, for example, a numerical value to be coded may be coded into a numeric code in base-16 ($=2^4$) representation. FIG. 13 is a diagram illustrating an example where numerical values are coded in hexadecimal representation by a decoding technique according to this embodiment. As illustrated in FIG. 13, a one-digit numerical value in hexadecimal representation is coded into five bits. For example, a hexadecimal numerical value, "F", is coded into a total of five bits including the instantaneous code, "0", and a code, "1111", of its numerical portion. A two-digit numerical value in hexadecimal representation is coded into ten bits. For example, a hexadecimal numerical value, "AA", is coded into a total of ten bits including the instantaneous code, "10", and a code, "11111111", of its numerical portion. In a case where decimal numerical values, "1" to "15", appear frequently in the target file 30, by coding of these in hexadecimal representation, the data are able to be compressed small.

Further, the coding and decoding apparatus 10 may compress data by finding an appearance frequency for each of numerical values to be coded and finding the "n" of the base-$2^n$ representation such that the data are reduced in total. For example, the calculation unit 44 calculates an appearance frequency of each of numerical values to be coded. The calculation unit 44 then calculates, for a case where respective numerical values in the target file 30 are compressed in base-$2^n$ representation, a total of code lengths of the numerical values, for each of different values of "n" changed in a predetermined change range, such as, for example, "1" to "5", in order from "1". For example, for each numerical value, the calculation unit 44 multiplies the number of bits in a $2^n$-base representation of the numerical value by its appearance frequency, to find code lengths of the respective numerical values for a case where the numerical values have been compressed. The calculation unit 44 then finds a code length of all of the numerical values by totaling the code lengths of the numerical values for the case where the numerical values have been compressed. The generation unit 42 may execute compression in base-$2^n$ representation with the smallest total. Thereby, the generation unit 42 is able to compress the target file 30 even more small. In this case, "n" of the base-$2^n$ representation that has been used is recorded in the coded file 31.

When the coded file 31 is decompressed, the decoder 52 of the decoding unit 50 decodes, based on the value of "n" from the coded file 31, the code of the numerical portion in n-bit units, into a numerical value. For example, when "n=2", the decoder 52 of the decoding unit 50 decompresses, as a base-4 representation, the code of the numerical portion in 2-bit units.

For example, with respect to the above described embodiments, the case where coding of data and decoding of data are executed by the coding and decoding apparatus 10 has been described, but coding of data and decoding of data may be executed by difference devices. For example, the coding and decoding apparatus 10 may be separated into: a coding device that has the coding unit 40 and executes coding of data; and a decoding device that has the decoding unit 50 and executes decoding of data.

Further, each component of the respective devices is functionally and conceptually illustrated in the drawings, and is not necessarily configured physically as illustrated in the drawings. That is, specific states of separation and integration of the respective devices are not limited only to those illustrated in the drawings, and all or a part of these devices may be configured to be functionally or physically separated or integrated in arbitrary units according to various loads and use situations. For example, the respective processing units, such as the coding unit 40 (the extraction unit 41, the generation unit 42, the output unit 43, and the calculation unit 44) and the decoding unit 50 (the identification unit 51 and the decoder 52), of the coding and decoding apparatus 10 may be integrated with one another as appropriate. Further, processing of each of the processing units of the coding and decoding apparatus 10 may be separated into processings by plural processing units, as appropriate. Furthermore, all or any part of the respective processing functions executed by the processing units may be implemented by a CPU and a program analyzed and executed by the CPU, or may be implemented as hardware by wired logic.

Coding Program

Figure 14:
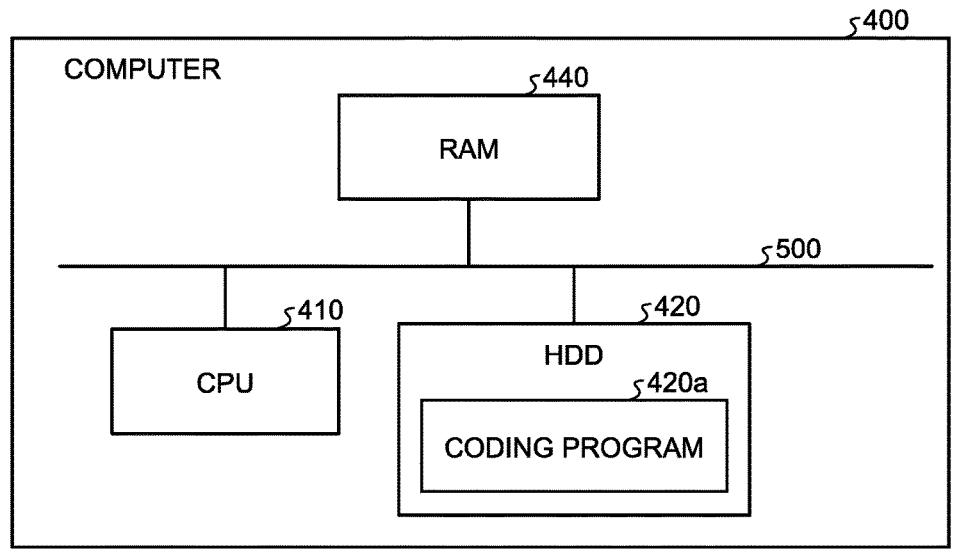
FIG. 14 is a diagram illustrating an example of a computer that executes a coding program.

In addition, the various types of processing described with respect to the above embodiments may be implemented by programs being executed by a computer system, such as a personal computer or a work station, the program having been prepared in advance. Accordingly, hereinafter, an example of a computer system that executes programs having the same functions as those of the above described embodiments will be described. Firstly, a coding program for execution of compression processing will be described. FIG. 14 is a diagram illustrating an example of a computer that executes the coding program.

As illustrated in FIG. 14, a computer 400 has a central processing unit (CPU) 410, a hard disk drive (HDD) 420, and a random access memory (RAM) 440. These units 400 to 440 are connected to one another via a bus 500.

The HDD 420 has a coding program 420a stored therein in advance, the coding program 420a demonstrating the same functions as those of the above described extraction unit 41, generation unit 42, output unit 43, and calculation unit 44. The coding program 420a may be divided as appropriate.

Further, the HDD 420 stores therein various pieces of information. For example, the HDD 420 stores therein an OS and various data used in compression.

By the CPU 410 reading and executing the coding program 420a from the HDD 420, operations that are the same as those of the respective processing units of the embodiments are executed. That is, through the coding program 420a, the same operations as those of the extraction unit 41, the generation unit 42, the output unit 43, and the calculation unit 44 are executed.

The above described coding program 420a is not necessarily stored in the HDD 420 in advance.

Decoding Program

Figure 15:
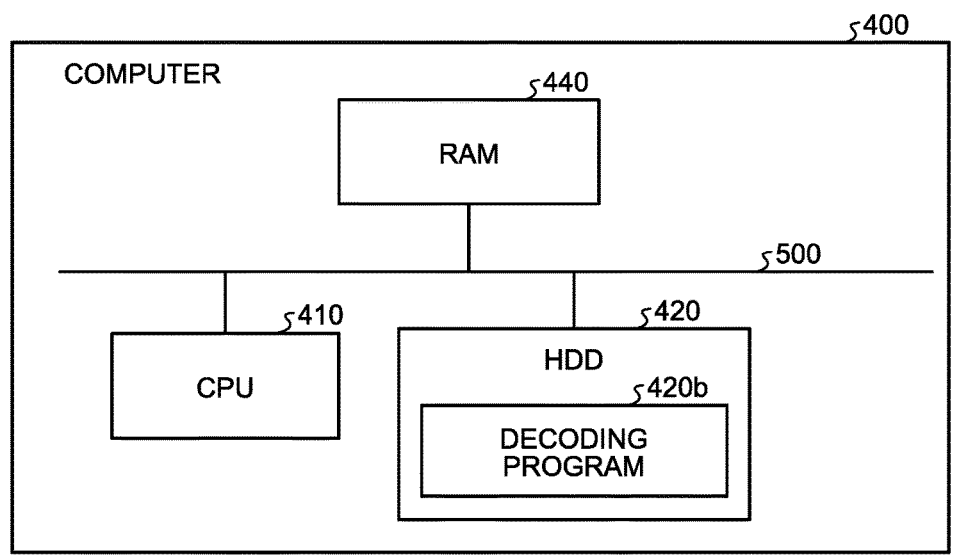
FIG. 15 is a diagram illustrating an example of a computer that executes a decoding program.

Next, a decoding program for execution of decoding will be described. FIG. 15 is a diagram illustrating an example of a computer that executes the decoding program. The same reference signs will be assigned to portions that are the same as those in FIG. 14, and description thereof will be omitted.

As illustrated in FIG. 15, the HDD 420 has a decoding program 420b stored therein in advance, the decoding program 420b demonstrating the same functions as those of the above described identification unit 51 and decoder 52. The decoding program 420b may be divided as appropriate.

Further, the HDD 420 stores therein various pieces of information. For example, the HDD 420 stores therein an OS and various data used in decoding.

By the CPU 410 reading and executing the decoding program 420b from the HDD 420, operations that are the same as those of the respective processing units of the embodiments are executed. That is, through the decoding program 420b, the same operations as those of the identification unit 51 and the decoder 52 are executed.

The above described decoding program 420b is also not necessarily stored in the HDD 420 in advance.

Further for example, the coding program 420a and the decoding program 420b may be stored in a "portable physical medium", such as a flexible disk (FD), a CD-ROM, a DVD disk, a magneto-optical disk, or an IC card, which is inserted in the computer 400. The computer 400 may read and execute the programs therefrom.

Further, the programs may be stored in advance in "another computer (or server)" that is connected to the computer 400 via a public network, the Internet, a LAN, a WAN, or the like. The computer 400 may then read and execute the programs therefrom.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a coding program that causes a computer to execute a process comprising:

coding a numerical value into a numeric code of base-$2^n$ representation; and generating code data that have been added with an instantaneous code that indicates a number of digits of the base-$2^n$ representation of the numerical value, the instantaneous code having bits associated with the numbers of digits from a head bit in an order of the number of digits, wherein "n" is a natural number equal to or greater than 1.

2. The non-transitory computer-readable recording medium according to claim 1, the process further comprising:

calculating appearance frequencies for each of the numbers of digits of the base-$2^n$ representation of a plurality of the numerical values to be coded, and wherein the generating generates the code data that have been added with the instantaneous code indicating the number of digits of the base-$2^n$ representation of the numerical value, the instantaneous code having bits associated with the numbers of digits from the head bit in a descending order of the calculated appearance frequencies of the numbers of digits.

3. A coding method executed by a computer, the coding method comprising:

coding a numerical value into a numeric code of base-$2^n$ representation; and generating code data that have been added with an instantaneous code that indicates a number of digits of the base-$2^n$ representation of the numerical value, the instantaneous code having bits associated with the numbers of digits from a head bit in order of the number of digits, wherein "n" is a natural number equal to or greater than 1.

4. A coding device, comprising:

a processor that executes a process comprising:

coding a numerical value into a numeric code of base-$2^n$ representation; and generating code data that have been added with an instantaneous code that indicates a number of digits of the base-$2^n$ representation of the numerical value, the instantaneous code having bits associated with the numbers of digits from a head bit in order of the number of digits, wherein "n" is a natural number equal to or greater than 1.

5. A non-transitory computer-readable recording medium having stored therein a decoding program that causes a computer to execute a process comprising:

identifying a number of digits, of a base-$2^n$ representation of a numerical value, from an instantaneous code of code data that have been added with an instantaneous code, wherein the code data includes a numeric code coded in base-$2^n$ representation, the instantaneous code indicates the number of digits of the base-$2^n$ representation of the numerical value to be coded, and the instantaneous code has bits associated with the numbers of digits from a head bit in order of the number of digits; and decoding the numeric code in n-bit units, into the numerical value, according to the identified number of digits, wherein "n" is a natural number equal to or greater than 1.

6. A decoding method executed by a computer, the decoding method comprising;

identifying a number of digits, of a base-$2^n$ representation of a numerical value, from an instantaneous code of code data that have been added with an instantaneous code, wherein the code data includes a numeric code coded in base-$2^n$ representation, the instantaneous code indicates the number of digits of the base-$2^n$ representation of the numerical value to be coded, and the instantaneous code has bits associated with the numbers of digits from a head bit in order of the number of digits; and decoding the numeric code in n-bit units, into the numerical value, according to the identified number of digits, wherein "n" is a natural number equal to or greater than 1.

7. A decoding device, comprising:

a processor that executes a process comprising:

identifying a number of digits, of a base-$2^n$ representation of a numerical value, from an instantaneous code of code data that have been added with an instantaneous code, wherein the code data includes a numeric code coded in base-$2^n$ representation, the instantaneous code indicates the number of digits of the base-$2^n$ representation of the numerical value to be coded, and the instantaneous code has bits associated with the numbers of digits from a head bit in order of the number of digits; and decoding the numeric code in n-bit units, into the numerical value, according to the identified number of digits, wherein "n" is a natural number equal to or greater than 1.

\* \* \* \* \*